United States Patent [19]

Kimura et al.

[11] Patent Number: 5,359,556
[45] Date of Patent: Oct. 25, 1994

[54] SEMICONDUCTOR MEMORIES WITH SERIAL SENSING SCHEME

[75] Inventors: Katsutaka Kimura, Akishima; Takeshi Sakata, Kunitachi; Kiyoo Itoh, Higashikurume, all of Japan

[73] Assignee: Hitachi, Ltd., Tokyo, Japan

[21] Appl. No.: 208,664

[22] Filed: Mar. 11, 1994

Related U.S. Application Data

[63] Continuation of Ser. No. 727,114, Jul. 9, 1991, Pat. No. 5,299,157.

[30] Foreign Application Priority Data

Jul. 9, 1990 [JP] Japan .................. 2-179673

[51] Int. Cl.$^5$ ................................. G11C 7/02
[52] U.S. Cl. ....................... 365/189.02; 365/207
[58] Field of Search .......... 365/189.02, 189.12, 365/207, 210, 222

[56] References Cited

U.S. PATENT DOCUMENTS 4,982,368  1/1991  Arimoto ..................... 365/207 X
5,299,157  3/1994  Kimura et al. ............. 365/189.02

FOREIGN PATENT DOCUMENTS 59-231852  12/1984  Japan .
1264692  10/1989  Japan .

OTHER PUBLICATIONS

1989 IEEE ISSCC Digest of Technical Papers, pp. 248–249.
1987 IEEE ISSCC Digest of Technical Papers, pp. 18–19.
1982 IEEE ISSCC Digest of Technical Papers, pp. 256–257.
IEEE, Trans. on Electron Devices, vol. 37, No. 3, (Mar. 1990), pp. 737–743.
1988 IEEE ISSCC Digest of Technical Papers, pp. 238–239.
1980 IEEE ISSCC Digest of Technical Papers, pp. 228–229.
1980 IEEE ISSCC Digest of Technical Papers, pp. 234–235.
Electronics (Jun. 22, 1978), pp. 133–137.

Primary Examiner—Steven Mottola
Attorney, Agent, or Firm—Antonelli, Terry, Stout & Kraus

[57] ABSTRACT

Signals are simultaneously read out from a plurality of memory cells connected to one selected word line onto respective data lines. By successively making a selection out of data lines, signals read simultaneously onto respective data lines are serially and successively sensed by means of one signal sensing means. As for restoring operation as well, restoring is successively performed via the signal transferring means on the basis of the result sensed by the signal sensing means. By thus making a plurality of data lines share either signal sensing means or both signal sensing means and restoring means, the number of these means can be reduced and the layout pitch of these means can be relaxed. Therefore, a semiconductor memory having a higher density can be realized.

24 Claims, 11 Drawing Sheets

F I G. 15
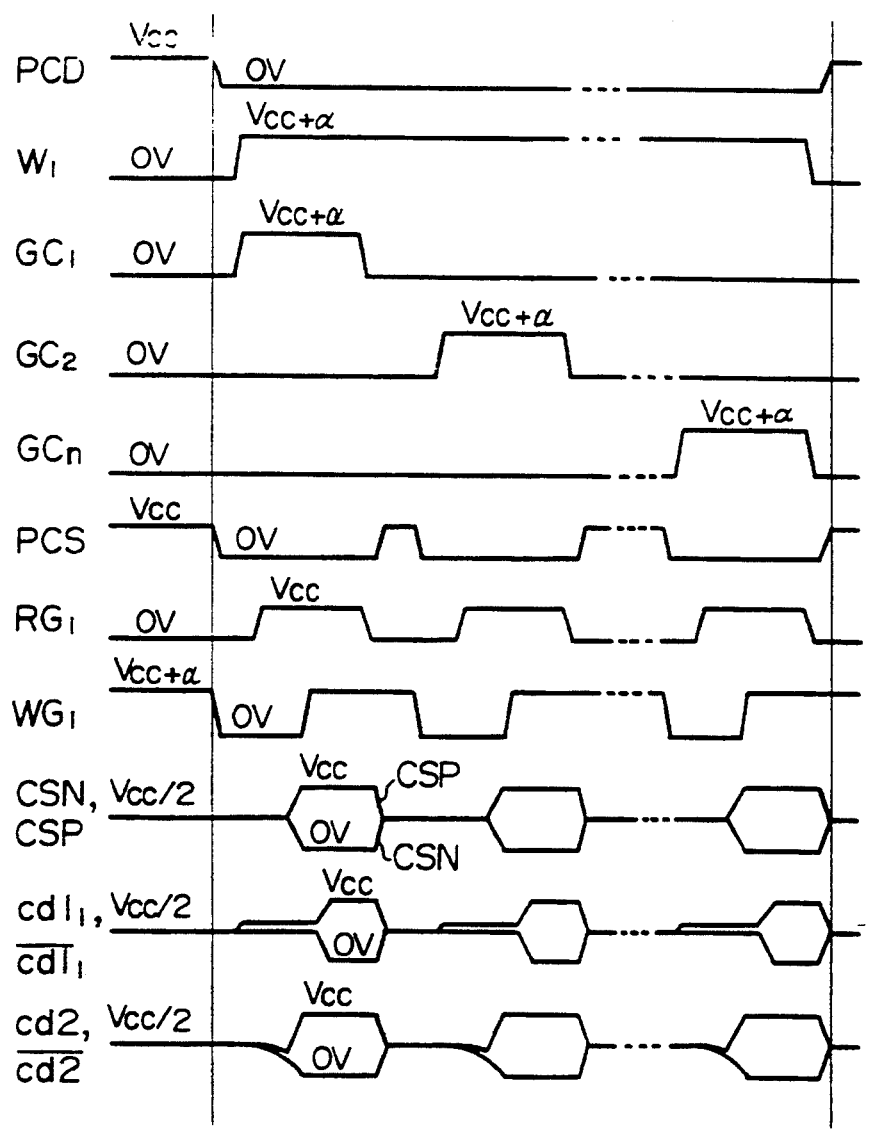

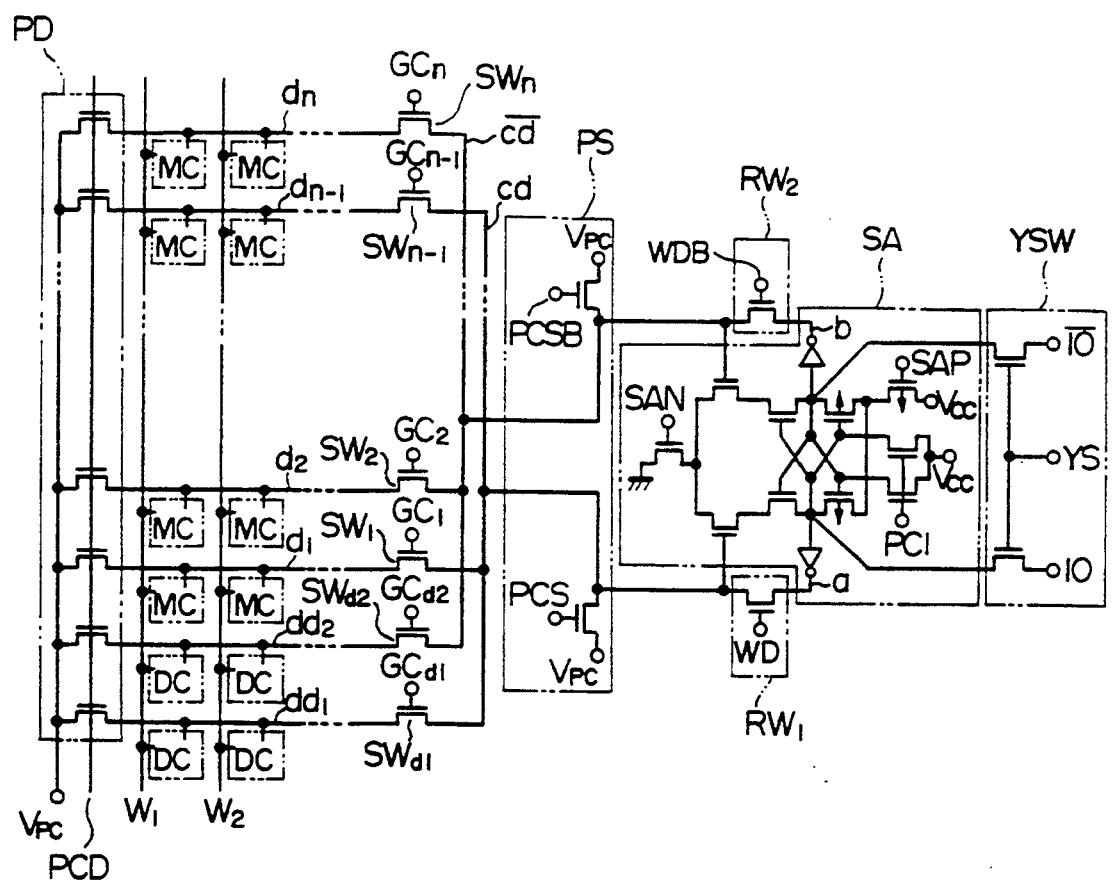
F I G. 16

SEMICONDUCTOR MEMORIES WITH SERIAL SENSING SCHEME

CROSS-REFERENCE TO RELEVANT APPLICATIONS

This is a continuation of application Ser. No. 07/727,114, filed Jul. 9, 1991, now U.S. Pat. No. 5,299,157.

The present application is relevant to U.S. patent application Ser. No. 07/695,983 filed May 6, 1991, entitled "Semiconductor Integrated Circuit" in the names of Y. Nakagome et al. and the contents of which are incorporated herein by reference.

BACKGROUND OF THE INVENTION

The present invention relates to a large scale semiconductor integration circuit, in particular to a semiconductor memory suitable for higher density.

In recent years, densities of semiconductor memories have been made higher and higher. Especially in semiconductor memories comprising dynamic memory cells such as memory cells of single-transistor, single-capacitor type, higher densities have been obtained because the number of elements included in each memory cell is small. The concept of memory array configuration of such a higher-density semiconductor memory is shown in FIG. 2. Memory cells MC (such as $MC_{11}$ and $MC_{12}$) are arranged at intersections of word lines $W_1$-$W_m$ and data lines $d_1$-$d_n$ in a matrix form. In this configuration, readout operation is performed as hereafter described. First of all, one word line such as $W_1$ is selected, whereby signals read out from memory cells connected to this word line appear on data lines $d_1$-$d_n$. Since these signals are typically minute, they are inputted to means for signal sensing $SA_1$-$SA_n$ disposed on respective data lines and sensed as pieces (e.g., data bits) of stored information. Thereafter one of these stored information pieces is selected and read out to the outside of the chip. In the case in which the memory cells are memory cells such as single-transistor, single-capacitor memory cells where from stored information is read destructively, the information must be restored. Therefore, the results sensed by the signal sensing means are restored into respective memory cells.

As for refresh operation, signals from the memory cells are first read out onto respective data lines in the same way as the readout operation and sensed by the signal sensing means. The results are restored into respective memory cells, the information stored in the memory cells being refreshed.

As for storing operation as well, signals from the memory cells are first read out onto respective data lines and sensed by the signal sensing means. Thereafter, information pieces inputted from the outside of the chip are selectively stored into desired memory cells by storing means (not illustrated). On the other hand, original stored information pieces are restored into remaining memory cells by using results sensed by the signal sensing means.

Once a certain word line is selected in each operation, signals are thus read out from all memory cells connected to that word line onto respective data lines. The signals must be sensed by the signal sensing means to restore the result. In the configuration of the prior art, therefore, signal sensing means is provided on each data line, or, in a case in which the signal sensing means does not have restoring function, both the signal sensing means and restoring means are provided on each data line. However, the signal sensing means and the restoring means occupy an extremely larger area than that of the memory cells. Further, in recent years, the occupied area has been reduced by providing memory cells with three-dimensional structures. Therefore, the relative occupied area of the signal sensing means and the restoring means has becomes further increased, thereby adversely influencing the development of higher density memories. Further, since the pitch of data lines becomes small, it becomes difficult to make the layout of the signal sensing and restoring means in accordance with that pitch, furthermore. Therefore, there has also been adopted a method whereby the signal sensing means are arranged alternately on both sides of the data line to relax the layout pitch of the signal sensing means as described in 1989 IEEE ISSCC Digest of Technical Papers, pp. 248-249, for example. Although this method is capable of relaxing the layout pitch of the signal sensing means to twice the pitch of the data lines, however, further improvement is impossible.

SUMMARY OF THE INVENTION

The present invention aims at solving the above described problems of the prior art. That is to say, an object of the present invention is to reduce the relative occupation area of the signal sensing means and the restoring means. Further, another object of the present invention is to realize a semiconductor memory having a higher density by facilitating the layout of these means.

The above described objects are achieved by providing either one signal sensing means or both signal sensing means and restoring means so as to be common to memory cells arranged at desired intersections of a plurality of word lines and a plurality of data lines in a matrix form, connecting respective data lines to these means via means for signal transferring having a switching function, and successively sensing signals of memory cells electrically connected to the word lines by means of the signal sensing means.

Signals are simultaneously read out from a plurality of memory cells connected to one selected word line onto respective data lines. By successively selecting a different one of a plurality of signal transferring means each having a switching function, a plurality of signals read simultaneously onto a plurality of data lines are serially and successively sensed by means of one signal sensing means. As for effecting a restoring operation as well, restoring is successively performed via the signal transferring means on the basis of the result sensed by the signal sensing means. By thus causing either the signal sensing means conventionally provided on each data line or both the signal sensing means and the restoring means conventionally provided on each data line to be shared by a plurality of data lines, the number of these means can be reduced and the layout pitch of these means can be relaxed. Therefore, a semiconductor memory having a higher density can be realized.

These and other objects and many of the attendant advantages of the present invention will become better understood by reference to the following detailed description when considered in connection with the accompanying drawing figures.

BRIEF DESCRIPTION OF THE DRAWINGS

FIG. 15 is an operation timing diagram illustrating the operation of FIG. 14;

FIG. 16 is a diagram showing a more concrete embodiment of FIG. 11;

DESCRIPTION OF THE PREFERRED EMBODIMENTS

The present invention will hereafter be described by referring to embodiments.

Figure 1A:
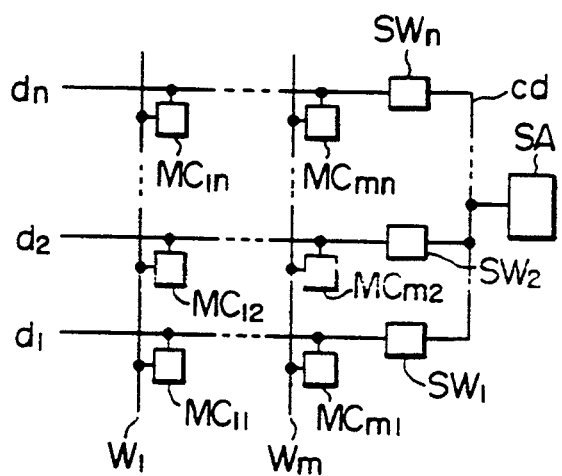
FIG. 1A is a memory array circuit diagram of a semiconductor memory according to the present invention.

FIG. 1A shows the concept of memory array configuration of a semiconductor memory according to the present invention. Memory cells MC (such as $MC_{11}$ and $MC_{12}$) are arranged at intersections of word lines $W_1$-$W_m$ and data lines $d_1$-$d_n$ in a matrix form. SA denotes signal sensing means, which is so provided as to be common to data lines $d_1$-$d_n$ and connected to the data lines via signal transferring means SW ($SW_1$-$SW_n$), respectively, having a switching function. Although not illustrated for brevity, a restoring means is separately provided so as to be common to data lines $d_1$-$d_n$ in a case in which the signal sensing means SA is not provided with a restoring function. A line cd denotes a common data line for selectively connecting the signal sensing means to a respective signal transferring means SW.

Figure 1B:
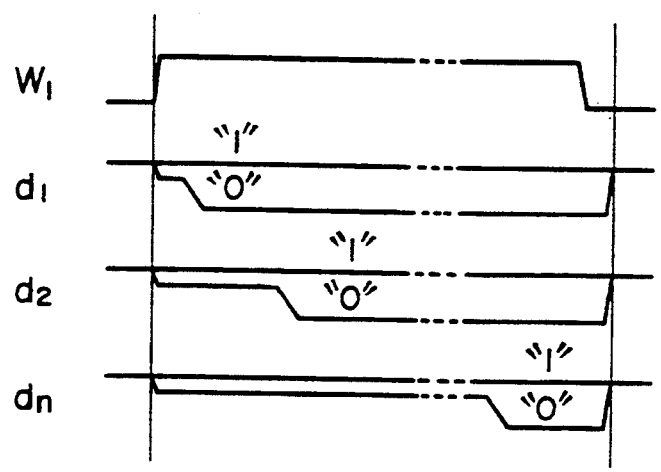
FIG. 1B is an operation timing diagram illustrating the operation of FIG. 1A.
Figure 2:
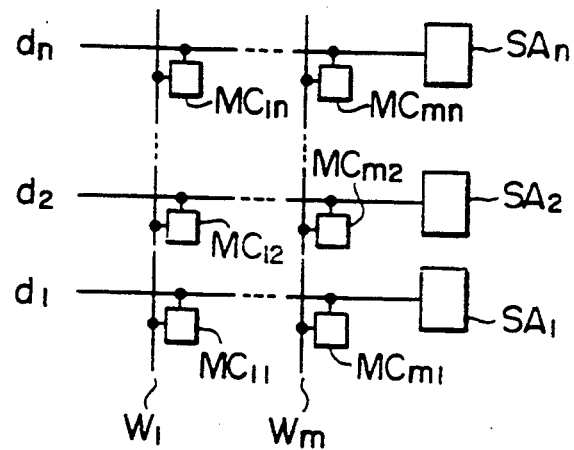
FIG. 2 is a memory array circuit diagram of a semiconductor memory of the prior art.

In this configuration, readout operation is performed as shown in FIG. 1B. Herein, description will be made assuming that the signal sensing means has restoring function. Even in the case in which a restoring means is separately provided, however, the basic operation remains the same, except for the restoring operation that would be performed by the restoring means. First of all, one word line such as $W_1$ is selected, whereby signals read out of memory cells connected to this word line appear simultaneously on respective data lines $d_1$-$d_n$. Thereafter, one signal transferring means such as $SW_1$ is selected, and a signal read out on the data line $d_1$ is inputted to the signal sensing means SA and sensed. Subsequently, another signal transferring means such as $SW_2$ is selected, and a signal read out on the data line $d_2$ is inputted to the signal sensing means SA and sensed. In the same way, signals read out on the data lines are successively sensed by the signal sensing means SA. In case of memory cells such as single-transistor, single-capacitor memory cells where from stored information is read out destructively and whereto the stored information must therefore be restored, whenever a signal on data lines is sensed by the signal sensing means, the information is restored onto the data line by using the result. That is to say, signal detection, and a restoring of information onto a data line, are performed repeatedly. After signal detection and a restoring of information onto a data line have been completed for all data lines, the word line is made unselected and restoring information into respective memory cells is thus completed.

Refresh operation is performed by taking one word line as the unit. That is to say, one word line is selected and signals are simultaneously read out from memory cells onto respective data lines. Subsequently, one signal transferring means is selected to sense a signal read out on a data line, and information is restored on the data line on the basis of the result. By successively selecting signal transferring means, this operation is repeated. After this operation has been repeated for all data lines, the word line is made unselected and refresh operation of stored information of respective memory cells connected to this word line is completed.

In a storing operation, signals on respective data lines read out by selecting one word line are successively sensed in the same way as the refresh operation. When signal transferring means corresponding to a desired memory cell is selected, information inputted from the outside of the chip is restored onto the data line via the signal transferring means. After sensing of signals on all data lines and the restoring of information onto the data lines has been finished, the word line is made unselected. Newly inputted information to be stored is stored into corresponding memory cells, whereas originally stored information is stored into remaining memory cells, the storing operation being thus completed.

In the foregoing description, the signal transferring means are successively selected in the order of $SW_1$, $SW_2$, . . . , for example. This selection method has an advantage of simple control because the order of selection is predetermined. However, selection of signal transferring means is not limited to this method. For example, signal transferring means may be selected at random. Alternatively, only the signal to be selected first of all may be selected randomly and the succeeding signal transferring means may be selected in order. In one of the latter cited methods, circulating order such as $SW_1 \rightarrow SW_2 \rightarrow \ldots \rightarrow SW_n \rightarrow SW_1$ is predetermined By way of an example, the first signal transferring means such as $SW_3$ is selected randomly and, thereafter, signal transferring means are successively selected in the order of $SW_3 \rightarrow SW_4 \rightarrow \ldots \rightarrow SW_1 \rightarrow SW_2$. If selection of signal transferring means is thus provided with flexibility, readout of information to the outside of the chip can be provided with flexibility, as will be described later. That is to say, the order of information pieces can be changed or high-speed readout becomes possible.

In accordance with the present invention, signals simultaneously read out on a plurality of data lines are successively sensed by one signal sensing means, as heretofore described. The information thus sensed can be read out outside the chip by means of one of various methods. For example, information successively sensed by the signal sensing means may be regarded as a group of data and read out outside the chip whenever sensed by the signal sensing means. In this case, data are successively read out as serial data, and a large number of data can be outputted by selecting a word line once. As a matter of course, serial data may be converted into parallel data before data are read out outside the chip and the resultant parallel data may be outputted at a time.

In combination with the above described method whereby only the signal transferring means to be selected first is selected randomly and subsequent signal transferring means are selected in serial order, a serial of serial data can be so rearranged as to become data having arbitrary data as leading data. Further, when the method of selecting signal transferring means at random is used, serial data can be rearranged into arbitrary order. That is to say, if the memory user arbitrarily sets the address signals to be inputted to the chip, the order of serial data can be arbitrarily set. Furthermore, these serial data can be read out by selecting a word line once, and hence high-speed readout becomes possible.

Further, it is also possible to read out only arbitrary data out of data sensed one after another by the signal sensing means. That is to say, the memory can also be configured as a so-called random-access memory, in which data are not handled as serial data, but only arbitary data are selectively read out. If this method is so adapted that when desired data is sensed out of data successively sensed by the signal sensing means that data is read out outside the chip, only the arbitrary data can be read out. In this case, however, the time taken for desired data to be read outside the chip, i.e., so-called access time differs depending upon the memory cell. That is to say, in case signal transferring means are selected in the order of $SW_1, SW_2, \ldots, SW_n$, the access time to the memory cell $MC_{11}$ differs from that to memory cell $MC_{1n}$ and access to $MC_{1n}$ becomes later. For preventing access time to desired data from varying widely, therefore, there is desired a combination with the above described method of selecting randomly only the signal transferring means to be selected first and selecting subsequent signal transferring means in serial order. That is to say, the signal transferring means corresponding to the memory cell storing desired data is first selected, and data sensed by the signal sensing means is read outside the chip. Thereafter signal transferring means are selected in serial order. By doing so, desired data are first sensed at all times, and hence unevenness of access time is prevented and access time can be shorted.

There are required as many signals as there are signal transferring means $SW_1$-$SW_n$, shown in FIG. 1A, to control those signal transferring means. As to a wiring layout of the signal lines, they may be disposed in parallel to the word lines or they may be disposed in parallel to the data lines.

In case the signal lines are arranged in the direction of the word lines, a large wiring area for the signal transferring means section is disadvantageously needed when the number of signal lines is large. Since it is unnecessary to pass signal lines through the area in which memory cells are arranged, however, there are advantages in the ① the same conductive layer as that of word lines can be used, and ② there is no coupling capacitance with respect to data lines and word lines.

On the other hand, arranging signal lines in the direction of data lines results in disadvantages in that ① a conductive layer which is different from that of data lines and word lines must be prepared, resulting in increased number of fabrication process steps, and ② there is coupling capacitance with respect to the data lines and word lines (i.e., there is a possibility of generation of coupling noise on data lines and/or word lines by a signal line). If a conductive layer which is different from that of data lines and word lines is used to make signal lines pass through the area in which memory cells are arranged, however, the area is not increased due to signal lines. The coupling noise between data lines and signal lines can be decreased by using a method as described in JP-A-59-231852, i.e., by making a signal line intersect a plurality of data lines. If a conductive layer acting as a shield layer is provided between signal lines and data lines or word lines, the coupling noise can be prevented.

Any method has both advantages and disadvantages. By considering the process technology such as the number of conductive layers and insulator thickness between conductive layers and the number of signal lines, therefore, an optimum method should be selected.

Signal transferring means will now be described. Signal transferring means may comprise one MOS transistor, for example. By connecting a data line and a common data line to the source and drain of the MOS transistor and applying a signal for controlling the signal transferring means to the gate, the MOS transistor can be provided with the function of a switch. In this case, signal transferring means has a simple structure comprising one MOS transistor, and the area occupied by the signal transferring means section can be made small.

Further, the signal transferring means may have a different structure. For example, signal transferring means as described in JP-A-1-264692 may be used. In this structure, a data line is connected to the gate of a MOS transistor, and a voltage signal read out on the data line is converted into a current signal and transferred to a common data line. If this signal transferring means is used for a single-transistor single-capacitor memory cell, therefore, influence of parasitic capacitance of the common data line is prevented. Accordingly, the signal voltage fed from a memory cell can be made large by that amount. In the same way as the above described case where signal transferring means comprises one MOS transistor. Write operation is performed by connecting the common data line to a data line via a MOS transistor.

By making a plurality of data lines share signal sensing means as heretofore described, the number of signal sensing means can be reduced in the present embodiment, and hence the chip area can be reduced. Further, the layout pitch of signal sensing means can be relaxed. Even if the density of memory cells is made higher, therefore, they can be fitted to the signal sensing means on the layout. Accordingly, a semiconductor memory having a higher density can be realized. On the other hand, in a semiconductor memory according to the present invention, data read out by selecting a word line once are serially sensed, and consequently the cycle time of a memory becomes longer than that of conventional semiconductor memories. Therefore, a semiconductor memory according to the present invention can be advantageously used in such an apparatus that an increase in cycle time can be allowed but a large amount of data must be stored. As an example therefore, file memory storing a large amount of data can be mentioned. Although magnetic disks are mainly used in conventional file memories, their operating speed (access time) is markedly slow as compared with semiconductor memories. By using a semiconductor memory according to the present invention, therefore, the operating speed of a file memory can be quickened in spite of the above described increase in cycle time. Further, sound memories are conceivable as different application. Although a large storage capacity is needed to store digital sound information, its data rate is typically several tens to one hundred kb/s and a semiconductor memory according to the present invention is sufficiently capable of coping with that speed. In addition, the apparatus can be made smaller in size and lighter in weight than apparatuses using magnetic tape or magnetic disks because mechanical components are not used.

Figure 3:
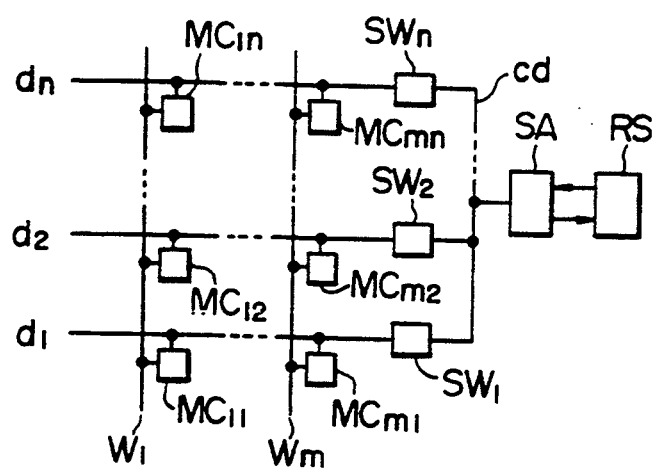
FIG. 3 is a diagram showing an embodiment in which a register is provided as part of a signal sensing means.

FIG. 3 shows another embodiment of the present invention. Whenever signals read out on respective lines are sensed by the signal sensing means in each operation of readout, refresh and restoring performed in the embodiment of FIGS. 1A and 1B, stored information is stored on data lines by using the result for restoring. On the other hand, the present embodiment is so adapted that signals on all data lines are sensed and thereafter restoring is successively performed via signal transferring means on the basis of all results thus detected. For that purpose, a register RS for temporarily storing the result sensed by the signal sensing means is provided in the signal sensing means section. Its operation will hereafter be described. First of all, signals read out simultaneously on respective lines $d_1$-$d_n$ are sensed by signal sensing means SA by selecting signal transferring means $SW_1$-$SW_n$ one after another. Whenever a signal is sensed, the result is stored into the register RS. After signals on all of data lines $d_1$-$d_n$ have been sensed, the signal transferring means $SW_1$-$SW_n$ are selected again one after another. Thereby information to be restored is stored on data lines by the signal sensing means (or restoring means (not illustrated) in case the signal sensing means is not provided with restoring function) on the basis of the result stored in the register RS. Finally, the operation is finished by bringing word lines $W_1$-$W_m$ to the unselected state. In case of storing operation, data stored on data lines become new data inputted from the outside of the chip by restoring the data in this register.

In the present embodiment, signals on all data lines are sensed, and the result is temporarily stored in the register. Therefore, reading store information outside the chip can be performed from this register. In case it is desired to read out certain specific data or a series of data stored in the register over and over again, therefore, data can be read out from this register, readout at high speed and with low power consumption being made possible. If a large number of memory array structures shown in FIG. 3 are provided, single word lines are simultaneously selected out of respective memory arrays, and data are read out into registers provided in respective memory arrays, then a larger amount of data can be read out outside the chip at high speed.

Figure 4:
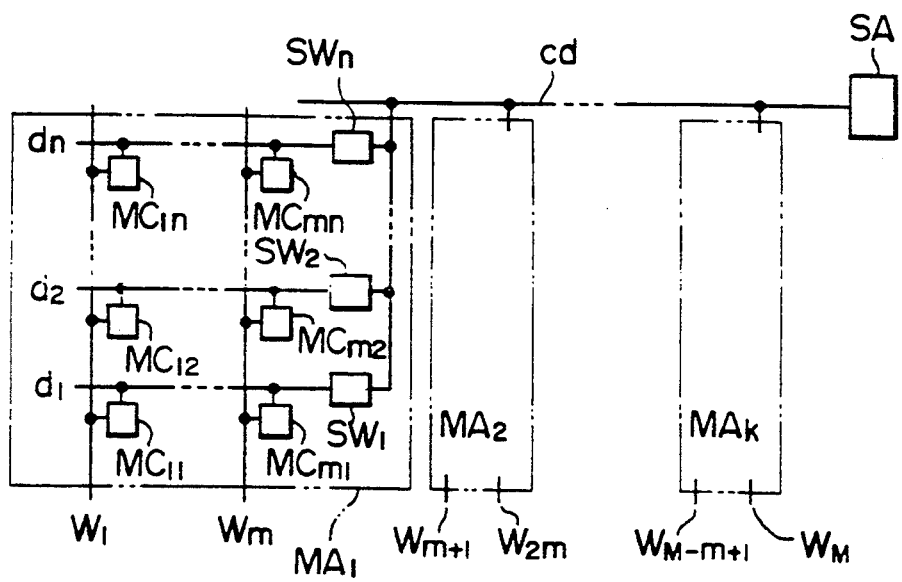
FIG. 4 is a diagram showing another embodiment of the present invention.

FIG. 4 shows another embodiment of the present invention. In this example, a plurality of memory arrays (MA) shown in FIG. 1A are provided and signal sensing means is so provided as to be common to those memory arrays. In FIG. 4, k memory arrays are provided. In FIG. 4, only one memory array is illustrated in the direction of word lines. By disposing a plurality of the memory array structures shown in FIG. 4 in the direction of word lines, however, a memory chip is formed.

Readout operation in the embodiment shown in FIG. 4 will hereafter be described. First of all, one out of a plurality of word lines such as a word line $W_1$ in a memory array $MA_1$ is selected. Thereupon signals read out from memory cells connected to this word line simultaneously appear on respective data lines $d_1$-$d_n$ in the memory array $MA_1$. Thereafter one signal transferring means such as $SW_1$ in the memory array $MA_1$ is selected, and the signal read out on the data line $d_1$ is inputted to signal sensing means SA via a common data line cd, the signal being thus sensed. Subsequently, different signal sensing means such as $SW_2$ is selected, and the signal read out on the data line $d_2$ is sensed by the signal sensing means SA. In the same way, signals read out on data lines are successively sensed by the signal sensing means. Whenever a signal on a data line is sensed by the signal sensing means in case of memory cells such as single-transistor single-capacitor memory cells where from stored information is read out destructively and whereto information must be restored, information is restored on the data line via the common data line and signal transferring means by the signal sensing means (or restoring means) by using the result thus sensed in the same way as the description made with reference to FIGS. 1A and 1B. After sensing signals on all data lines and restoring those signals on the data lines have been finished, the word line is made unselected, restoring for respective memory cells being thus completed.

Refresh operation is performed by taking one word line as the unit in the same way as the embodiment of FIGS. 1A and 1B. That is to say, one word line in one memory array such as $MA_1$ is selected, and signals from memory cells are simultaneously read out on respective data lines in this memory array. Subsequently one signal transferring means is selected to sense the signal read out on the data line, and information is restored on that data line on the basis of the result. Signal transferring means are successively selected to repeat this operation. After this operation has been repeated for all data lines in the memory array $MA_1$, the word line is made unselected, refresh of stored information in respective memory cells connected to this word line being thus completed. Similar operation is performed for other word lines in the memory array $MA_1$ and word lines in other memory arrays. Thereby stored information of all memory cells can be refreshed. As for storing operation, one word line in one memory array is selected and signals thus read out on respective data lines are successively sensed in the same way as the refresh operation. When signal transferring means corresponding to a desired memory cell is selected, information inputted from the outside of the chip is stored on the data line via the signal transferring means. After sensing signals on all data lines in the memory cell and restoring on data lines have been finished, the word line is made unselected. Thereupon newly inputted information is stored into the desired memory cell and originally stored data are stored into remaining memory cells, the storing operation being thus completed.

In the present embodiment, a plurality of data lines share signal sensing means. In addition, a plurality of memory arrays can share the signal sensing means. Therefore, the relative area occupied by the signal sensing means can be further reduced.

Further, different operation can be conducted in the embodiment shown in FIG. 4 when occasion demands. That is to say, one word line is selected in each of memory arrays $MA_1$-$MA_k$ and signals are simultaneously read out on respective data lines in each memory array. Then signals on data lines in one memory array are serially sensed by the signal sensing means as described before. After signals on all data lines in this memory array have been sensed, signals on data lines in another memory array are serially sensed. Such operation is performed for all memory arrays. Owing to such operation, a larger number of signals can be read out by selecting a plurality of word lines once. Therefore, such operation is suitable for the case where a large number of serial data are handled.

Figure 5:
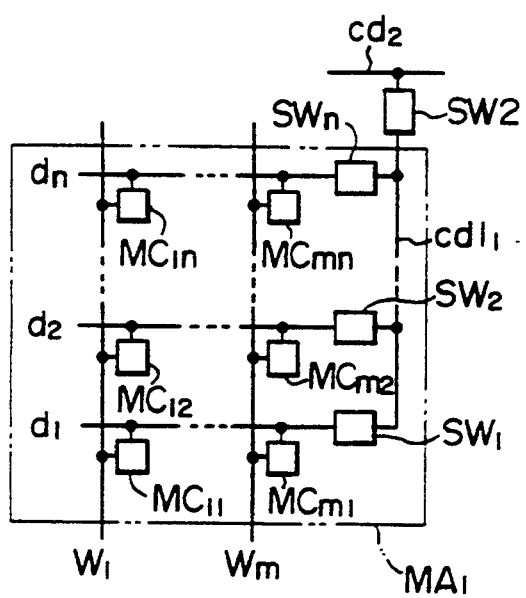
FIG. 5 is a diagram showing still another embodiment of the present invention.

In the embodiment shown in FIG. 4, a large number of signal transferring means are connected to the common data line. Therefore, its parasitic capacitance becomes large and poses problems in signal-to-noise ratio and operating speed in some cases. In that case, the common data line may be divided as shown in FIG. 5 to decrease respective parasitic capacitance values. In FIG. 5, the common data line is divided into a common data line cd2 so provided as to be common to memory arrays and common data lines cd1 provided within respective memory arrays, and they are connected via signal transferring means SW2. As the signal transferring means SW2, the same means as the signal transferring means described with reference to FIG. 1A can be used. As a combination of the signal transferring means SW and the signal transferring means SW2, the following structure can be mentioned. For instance, each of signal transferring means SW provided in relatively large numbers may comprise one MOS transistor, and the signal transferring means SW2 may comprise signal transferring means described by referring to FIG. 1A in which signal voltage is converted to signal current in readout operation. In this case, the area occupied by the signal transfering means provided in relatively large numbers can be made small, and parasitic capacitance of the common data lines cd1 and that of the common data line cd2 can be completely separated in readout operation. Therefore, high-speed readout with high signal-to-noise ratio becomes possible.

The present invention will now be described in more detail by taking a single-transistor single-capacitor memory cell as an example.

Figure 6:
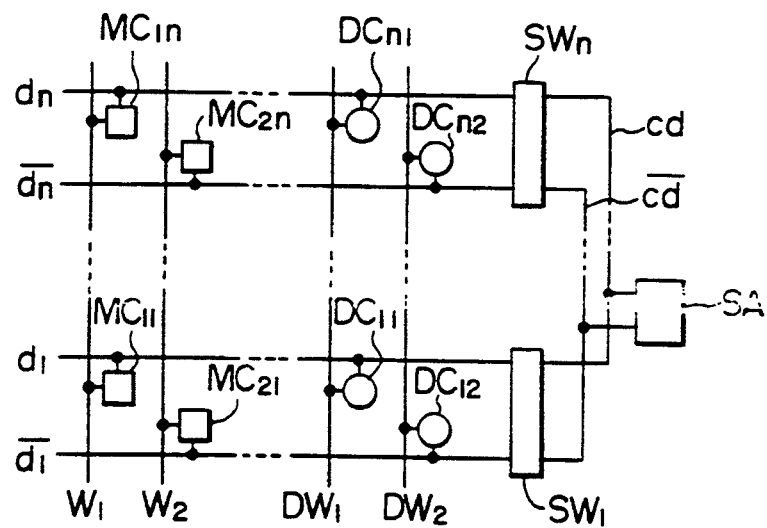
FIG. 6 is a diagram showing an embodiment of the present invention in conjunction with a folded data-line memory array circuit arrangement of single-transistor, single-capacitor type memory cells.
Figure 7:
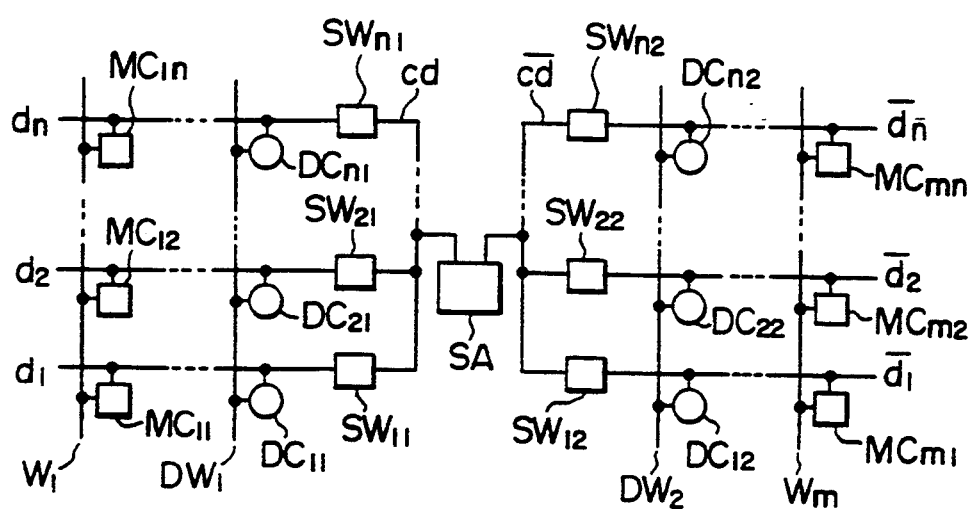
FIG. 7 is a diagram showing an embodiment of the present invention in conjunction with an open data-line memory array circuit arrangement of single-transistor, single-capacitor type memory cells.

FIG. 6 and FIG. 7 show other embodiments of the present invention, which are examples suitable for the case where signals fed from memory cells each comprising a single transistor and a single capacitor are sensed differentially. FIG. 6 shows an embodiment of folded data-line arrangement and FIG. 7 shows an embodiment of open data-line arrangement. In FIGS. 6 and 7, $DW_1$ and $DW_2$ denote dummy word lines, and $DC_{11}$, $DC_{12}$, etc., denote dummy cells. Readout operation will now be described. First of all, one word line and one dummy word line are selected. A combination of a word line and a dummy word line is so selected that a memory cell signal and a reference signal fed from a dummy cell may be outputted respectively on paired data lines. For example, the dummy word line $DW_2$ is selected in case a word line $W_1$ is selected. Thereby signals of memory cells $MC_{11}$-$MC_{1n}$ and signals of dummy cells $DC_{12}$-$DC_{n2}$ are simultaneously read out on data lines $d_1$-$d_n$ and data lines $\bar{d}_1$-$\bar{d}_n$, respectively. Subsequently, signal transferring means $SW_1$ ($SW_{11}$ and $SW_{12}$ in case of FIG. 7) connected to paired data lines such as $d_1$ and $\bar{d}_1$ is selected, and signals read out on the paired data lines $d_1$ and $\bar{d}_1$ are inputted to signal sensing means SA and amplified therein as differential signals. Signals thus amplified are stored on the paired data lines $d_1$ and $\bar{d}_1$ via the signal transferring means $SW_1$ ($SW_{11}$ and $SW_{12}$ in case of FIG. 7). Thereafter the signal transferring means $SW_1$ ($SW_{11}$ and $SW_{12}$ in case of FIG. 7) is made unselected, and the next signal transferring means is selected. In the same way, signal transferring means are successively selected and signals read out on respective paired data lines are successively amplified. By repeating this operation for all paired data lines, amplified signals are stored on all paired data lines. By making the word line unselected, amplified signals are restored into respective memory cells, the readout operation being thus completed. Refresh operation is also performed in the same way as the readout operation. Storing operation is also performed in the same way as the readout operation. That is to say, when signal transferring means corresponding to a desired memory cell is selected, information inputted from the outside of the chip is stored on the data line via the signal transferring means to perform storing operation.

Even if memory cells comprise high-density single transistors and single capacitors, the layout of the signal sensing means is also facilitated in the present embodiment because a plurality of paired data lines share the signal sensing means. Further, high-speed operation with high signal-to-noise ratio becomes possible because signals are differentially sensed. In the embodiment shown in FIG. 6, operation with a higher signal-to-noise ratio becomes possible because of folded data-line arrangement. On the other hand, the embodiment shown in FIG. 7 is inferior to the embodiment shown in FIG. 6 in signal-to-noise ratio. In the embodiment shown in FIG. 7, however, the area of a memory cell can be made smaller because of open data-line arrangement allowing a memory cell to be placed at every intersection of word line and data line. In the conventional memory cell placement method, it was necessary to make the layout of the signal sensing means with the pitch per data line, and it was difficult to make the layout. Owing to the present invention, however, that problem can be solved.

Figure 8:
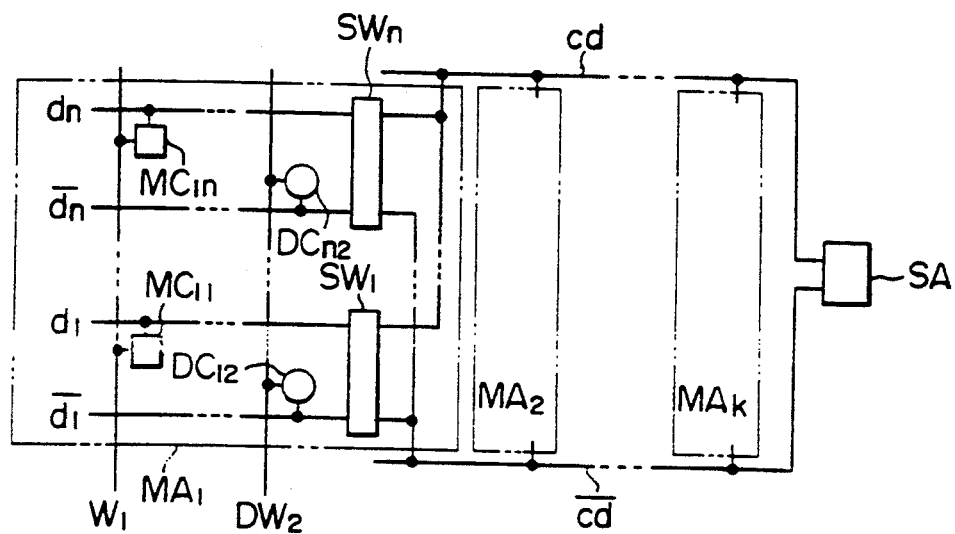
FIG. 8 is a diagram showing an embodiment of the present invention in which a plurality of memory arrays share a sensing means and in which the memory arrays are of the folded data-line type arrangement.

FIG. 8 shows another embodiment of the present invention. In this example, a plurality of memory arrays share signal sensing means as in the embodiment shown in FIG. 4. Each memory array has the structure shown in FIG. 6, i.e., folded data-line arrangement, and signals fed from a memory cell are sensed differentially. In the present embodiment, the relative area occupied by the signal sensing means can be made small as described before with reference to FIG. 4, and high-speed operation with a high signal-to-noise ratio becomes possible because signals are handled differentially.

Figure 9:
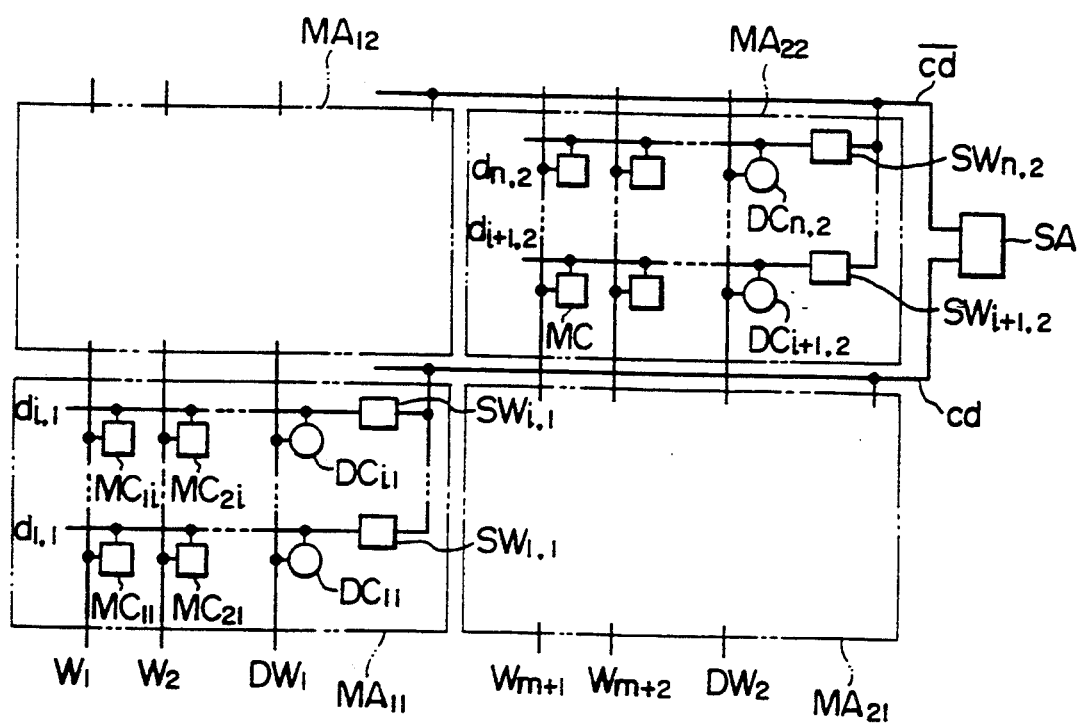
FIG. 9 is a diagram showing an embodiment of the present invention in which a plurality of memory arrays, configured as open data-line type arrangements, share a sensing means, and in which common paired data lines constitute a folded data-line arrangement when viewed from the signal sensing circuit.

FIG. 9 shows another embodiment. In the present embodiment, memory cells are placed in an open data-line arrangement, but common paired data lines have folded data-line arrangement when viewed from signal sensing means. Each memory array has open data-line arrangement in which memory cells are placed at intersections of a plurality of word lines and data lines in a matrix form. Further, dummy cells and a dummy word line are provided in each memory array. Therefore, each memory array has the same structure as the left half of the memory array structure shown in FIG. 7. Each data line is connected to either common data line $\overline{cd}$ cd or common data line $\overline{cd}$ via signal transferring means SW (such as $SW_{1,1}$ or $SW_{i,1}$). Further, memory arrays $MA_{11}$ and $MA_{21}$ are connected to the common data line cd, and memory arrays $MA_{12}$ and $MA_{22}$ are connected to the common data line $\overline{cd}$. Readout operation in this structure will now be described.

First of all, one word line and a dummy word line belonging to a memory array whereto that word line does not belong are selected. For example, a word line $W_1$ and a dummy word line $DW_2$ are selected. Thereupon signals from memory cells connected to the word line $W_1$ are read out onto respective data lines included in the memory arrays $MA_{11}$ and $MA_{12}$. On the other hand, reference signals from dummy cells connected to the dummy word line $DW_2$ are read out onto respective data lines included in the memory arrays $MA_{21}$ and $MA_{22}$. Then one signal transferring means included in the memory array $MA_{11}$ or $MA_{12}$ is selected. Signal transferring means in the memory array $MA_{21}$ or $MA_{22}$ connected to the common data line, whereto the signal transferring means thus selected is not connected, is selected. That is to say, in case one signal transferring means within the memory array $MA_{11}$ is selected, one signal transferring means within the memory array $MA_{22}$ is simultaneously selected. Or in case one signal transferring means within the memory array $MA_{12}$ is selected, one signal transferring means within the memory array $MA_{12}$ is simultaneously selected. For example, a combination of $SW_{1,1}$ and $SW_{i+1,2}$ is selected. As a result, memory cell signals and reference signals are read out on the common paired data lines cd and $\overline{cd}$. In case a combination of $SW_{1,1}$ and $SW_{1+1,2}$ is selected, for example, the signal read out from a memory cell $MC_{11}$ is read out on the common data line cd. Further, a reference signal read out from a dummy cell $DC_{i+1,2}$ is read out on the common data line $\overline{cd}$. These signals are inputted to the signal sensing means SA as differential signals and thereafter amplified. The amplified signals are stored on data lines $d_{1,1}$ and $d_{i+1,2}$ via the common data lines and signal transferring means, and the signal transferring means $SW_{1,1}$ and $SW_{i+1,2}$ are made unselected. Subsequently, a different combination of signal transferring means is selected and signals are amplified in the same way. In the same way, signals read out from respective memory cells are successively amplified, and data are stored on respective data lines for restoring operation. Finally, by making the word line unselected, restoring data into memory cells is finished, readout operation being thus completed. Refresh operation can be conducted in the same way as the readout operation.

When signal transferring means corresponding to a desired memory cell is selected, storing operation can be conducted by storing data inputted from the outside of the chip on the data line via the common data line and signal transferring means.

In the present embodiment, open data-line arrangement, in which memory cells are arranged at respective intersections of data lines and word lines, is adopted, and consequently higher density is made possible. This is because the number of signal sensing means can be reduced and the layout pitch can be relaxed owing to the present invention. Further, because of folded common data-line arrangement, noises caused by parasitic capacitance between common data lines and word lines can be removed. Thereby common paired data lines can be provided with the feature of higher signal-to-noise ratio of folded data-line arrangement.

Figure 10:
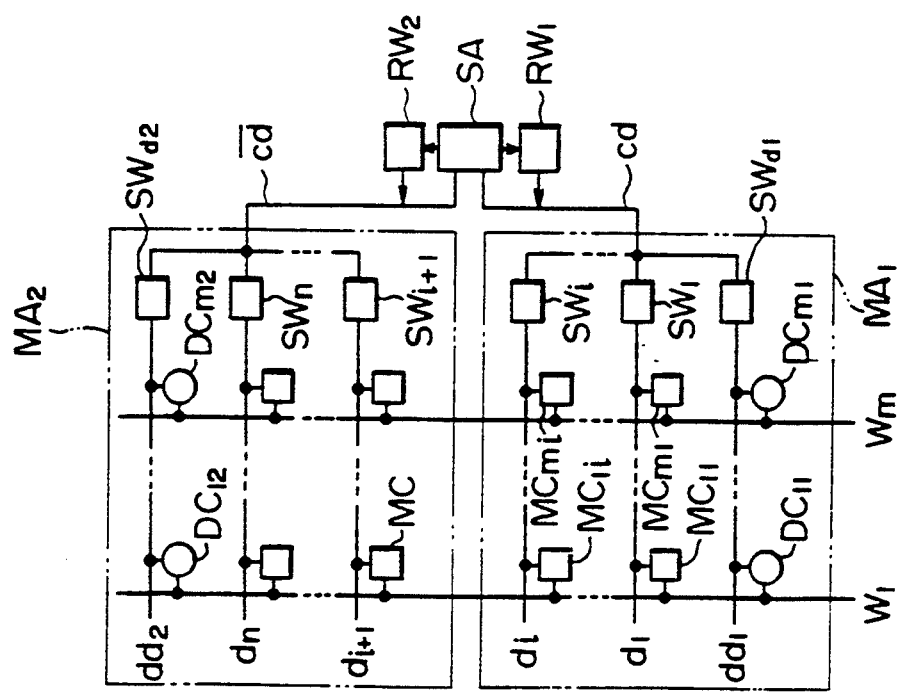
FIG. 10 is a diagram showing another embodiment of the present invention in which an open data-line arrangement, combined with a sensing circuit, is employed and in which single-transistor, single-capacitor type memory cells are arrayed as both storage cells and dummy cells.

FIG. 10 shows another embodiment of the present invention, in which single-transistor single-capacitor memory cells are placed in an open data-line arrangement in the same way as FIG. 9. Further, this example is so configured that a data line where from a memory cell signal has been read out and a data line where from a reference signal paired with that memory cell signal has been read out may intersect the same word line. That is to say, there is adopted a structure which aims at making the most of both the merit of higher density of open data-line arrangement and the merit of higher signal-to-noise ratio of folded data-line arrangement. In the present embodiment, therefore, data lines whereto only dummy cells (such as $DC_{11}$ and $DC_{12}$) are connected, i.e., dummy data lines $dd_1$ and $dd_2$ are so provided separately from data lines whereto memory cells are connected as to be common to a plurality of data lines. The dummy data lines $dd_1$ and $dd_2$ are connected to common data lines cd and $\overline{cd}$ via signal transferring means $SW_{d1}$ and $SW_{d2}$, respectively. Further, dummy cells are connected to the same word line as memory cells. Dummy data lines are paired with data lines at the time of signal sensing as described later. Therefore, the structure must be so formed that their electrical characteristics such as parasitic capacitance values may balance those of data lines. Further, a dummy cell is so adapted that it may output, on a dummy data line, a nearly middle level between voltage levels which are produced on data lines when data "1" and "0" stored in memory cells are read out from the memory cells. An example of concrete structure of dummy data lines and dummy cells will be described later.

Readout operation in this structure will now be described. First of all, one word line such as $W_1$ is selected. Thereupon memory cell signals are simultaneously read out from memory cells connected to this word line onto respective data lines $d_1$-$d_n$. At the same time, reference signals are read out from the dummy cells $DC_{11}$ and $DC_{12}$ onto the dummy data lines $dd_1$ and $dd_2$ respectively. Then signal transferring means are successively selected to amplify signals on respective data lines. Its method will now be described. By using a reference signal read out on the dummy data line $dd_1$ in a memory array $MA_1$, all of memory cell signals read out on respective data lines in a memory array $MA_2$ are first amplified. Subsequently by using a reference signal read out on the dummy data line $dd_2$ in the memory array $MA_2$, all of memory cell signals read out on respective data lines in the memory array $MA_1$ are amplified. To be concrete, signal transferring means $SW_{d1}$ connected to the dummy data line $dd_1$ is selected, and the reference signal on the dummy data line $dd_1$ is read out on the common data line cd. Further, signal transferring means $SW_{i+1}$ connected to a data line $d_{i+1}$ in the memory array $MA_2$ is selected, and a memory cell signal on the data line $d_{i+1}$ is read out onto the common data line $\overline{cd}$. These signals read out on the common data lines are inputted to signal sensing means SA and amplified differentially. By using the result, information to be restored is restored on the data line $d_{i+1}$ by restoring means $RW_2$ via the common data line $\overline{cd}$ and the signal transferring means $SW_{i+1}$. In the same way, signals read out on data lines included in the memory array $MA_2$ are differentially amplified one after another by using reference signals read out on the common data line cd, and data to be restored are stored on data lines. At this time, it is important to hold the reference signal read out on the common data line cd until all of signals read out on data lines in the memory array $MA_2$ have been amplified. After all of signals read out on data lines in the memory array $MA_2$ are amplified and data to be restored are stored on data lines, the signal transferring means $SW_{d2}$ connected to the dummy data line $dd_2$ is then selected and the reference signal on the dummy data line $dd_2$ is read out on the common data line $\overline{cd}$. Further, signal transferring means $SW_1$ connected to the data line $d_1$ is selected, and the memory cell signal on the data line $d_1$ is read out on the common data line cd. These signals are inputted to the signal sensing means SA and amplified differentially therein. By using that result, information to be restored is stored on the data line $d_1$ via the common data line cd and the signal transferring means $SW_1$ by restoring means $RW_1$. In the same way, signals read out on data lines included in the memory array $MA_1$ are differentially amplified one after another by using reference signals read out on the common data line $\overline{cd}$, and data to be restored are stored on data lines. After data to be restored are stored on all data lines, finally the word line is made unselected and data stored on data lines are stored into memory cells, the readout operation being finished.

Refresh operation can be conducted in the same way as the readout operation. Storing operation is also conducted in the same way as the readout operation. When signal transferring means corresponding to a desired memory cell is selected, information inputted from the outside of the chip is stored on data line via a common data line and signal transferring means. Thereby storing operation can be conducted. At this time as well, however, the reference signal on a common data line paired with the common data line whereto a desired memory cell is connected must be held in the same way as restoring in the readout operation.

In the foregoing description, signals in the memory array $MA_2$ are amplified earlier. As a matter of course, however, signals in the memory array $MA_1$ may be first amplified and signals in the memory array $MA_2$ may be amplified thereafter. Further, the order of amplification of signals in each memory array can be arbitrarily set as described before by referring to the embodiment shown in FIGS. 1A and 1B.

As described before, the reference signal read out on one of the common data lines must be held in the present embodiment until all of signals on the data line in the memory array connected to the other of the common data lines have been amplified completely. As signal sensing means, therefore, the circuit comprising cross-coupled CMOS inverters often used in MOS dynamic random-access memories (as described in 1987 IEEE ISSCC Digest of Technical Papers, pp. 18-19, for example) cannot be used. In this circuit, the common data line is charged and discharged to amplify a signal on the common data line, and consequently the amplified signal is stored on a data line as it is. That is to say, this circuit has restoring function, but it is not suitable to the present embodiment. As signal sensing means, such an amplifier having a MOS transistor gate as the input terminal that the input signal is not changed by amplification, such as a current Miller amplifier frequently used in MOS static random-access memories (as described in 1982 IEEE ISSCC Digest of Technical Papers, pp. 256-257) can be used. Further, since this kind of signal sensing means is not provided with restoring function, restoring means (such as $RW_1$ and $RW_2$ in FIG. 10) for receiving the result of amplification in the signal sensing means and storing the information to be restored onto respective data lines must be provided.

In the present embodiment, a plurality of data lines share the signal sensing means and restoring means, and consequently it becomes possible to make a layout of these means without being restricted by the pitch of data lines. Therefore, memory cells can be placed in an open data-line arrangement allowing a higher density. In addition, a plurality of data lines share a dummy data line, and a data line and a dummy data line paired of the time of signal sensing are adapted to intersect the same word line. Owing to such a structure, operation with a high signal-to-noise ratio becomes possible.

Figure 11:
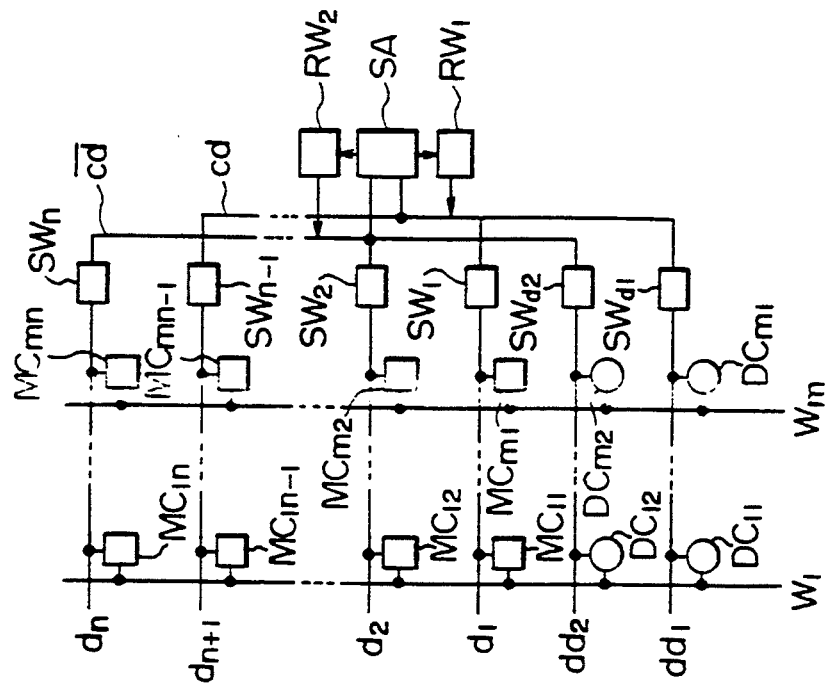
FIG. 11 is a diagram showing a further embodiment of the present invention adopting an open common data-line arrangement.

FIG. 11 shows another embodiment of the present invention. In the embodiment shown in FIG. 10, common paired data lines are open toward both sides when viewed from the signal sensing means, i.e., an open common data-line arrangement is adopted. The present embodiment improves upon this point, in which common paired data lines cd and $\overline{cd}$ are placed in close vicinity to make noises from a noise source equivalent as far as possible. Operation can be conducted in the same way as FIG. 10.

Whenever a signal read out on a data line is inputted to the signal sensing means and amplified therein, information to be restored is stored on the data line by using the result. In the embodiments heretofore described by referring to FIG. 6 to FIG. 11, restoring information onto a data line is thus performed. When the pitch of data lines has become small, it is necessary to take care of noises caused by coupling capacitance between data lines. For example, it is now assumed in FIG. 7 that a signal on the data line $d_1$ is amplified and information to be restored is stored on the data line $d_1$. If a signal, which is not yet amplified, is present on the data line $d_2$ at that time, large noises are induced on the data line $d_2$ by coupling capacitance between data lines $d_1$ and $d_2$ when information to be restored is stored on the data line $d_1$. When a signal on the data line $d_2$ is to be sensed by the signal sensing means, this might cause false sensing.

However, this problem can be avoided by using such memory cells that coupling capacitance between data lines is made small by shielding a data line from another data line by a different conductive layer as described in IEEE, Trans. on Electron Devices, vol. 37, No. 3 (March 1990) pp. 737-743, for example. Alternatively, this problem can be solved by using a structure similar to that of FIG. 3. That is to say, a register RS for temporarily storing the result of amplification performed by signal sensing means and restoring means for storing data to be stored on respective data lines on the basis of contents of the register RS are disposed in the signal sensing means section. Every time a signal read out on each data line is sensed by signal sensing means, that information is stored in the register. After signals on all data lines have been sensed, data to be restored are successively stored on data lines by the restoring means on the basis of data stored in the register. Finally, the word line is made unselected, restoring being finished. In this method, signals on all data lines are sensed and thereafter restoring is performed. That is to say, the above described problem can be avoided by using such a circuit that the input signal is not changed by amplification as described with reference to the embodiment of FIG. 10 as the signal sensing means. Data lastly sensed may be restored on the data line by the restoring means immediately after the sensing. Therefore, the number of registers may be the number of data sensed by the signal sensing means less one. For example, the number of registers may be n−1 in the embodiment shown in FIG. 6.

Further, as different method for avoiding the above described problem of noise caused by coupling capacitance between data lines, a method described in 1988 IEEE ISSCC Digest of Technical Papers, pp. 238–239 can be used in case of the folded data-line arrangement as shown in FIG. 6. That is to say, the above described problem of noise can also be avoided by making paired data lines intersect with each other. By making data lines intersect with each other, noises from adjacent data lines can be made equal on paired data lines, and consequently the above described problem can be avoided.

Further, as a different method for avoiding the above described noise problem, an amplifier for amplifying a signal read out on each data line can also be placed on each data line. In this case, it is desirable that the amplifier amplifies the signal to such a degree that operation failure is prevented even under noise caused by restoring data on adjacent data lines. This amplifier must have a simple structure as far as possible. For example, in case a folded data-line arrangement as shown in FIG. 6 is adopted, an amplifier of dynamic type comprising two cross-coupled NMOS transistors as described in 1980 IEEE ISSCC Digest of Technical Papers, pp. 228–229 is preferably provided. Each of memory cells and the above described signal transferring means comprises an NMOS transistor. By using the above described amplifier, it can comprise only MOS transistors of the same conduction type. Unlike amplifiers comprising CMOS transistors, therefore, N-wells are not needed and the area for well isolation is not required. Therefore, the occupied area can be made small.

Although some embodiments have heretofore been described, more concrete embodiments will hereafter be described.

Figure 12:
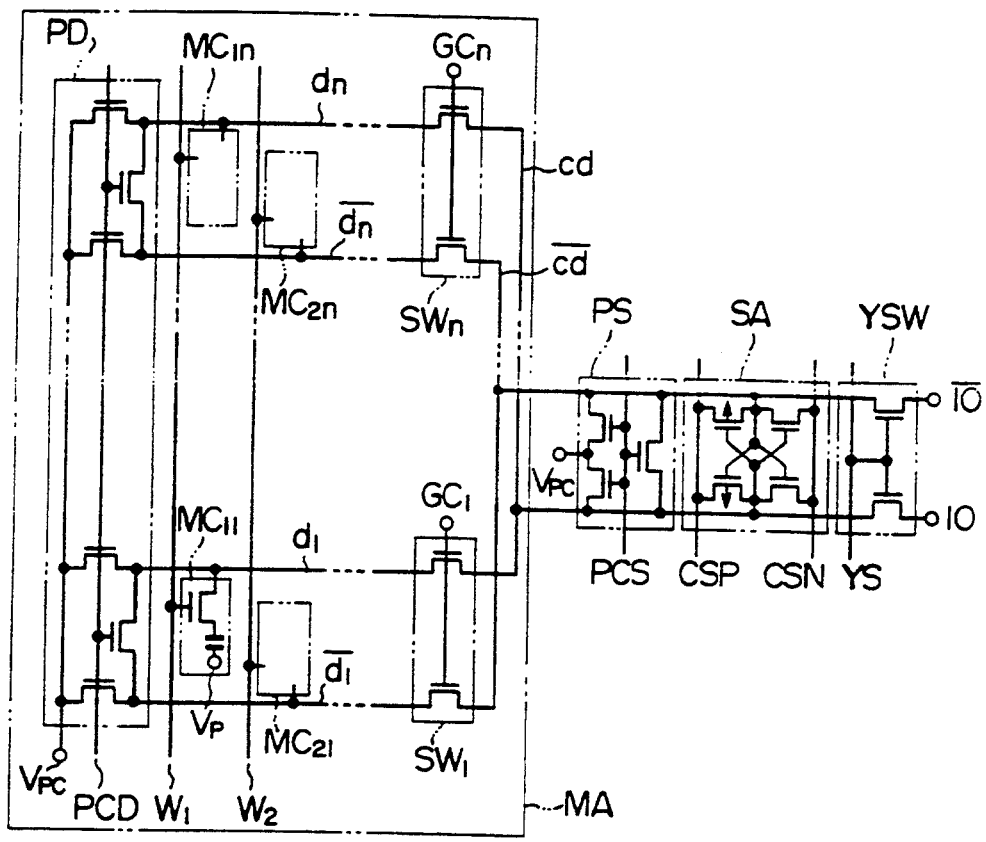
FIG. 12 is a diagram showing a more concrete embodiment of FIG. 6.

FIG. 12 shows a more concrete embodiment of the present invention, which corresponds to the embodiment described before by referring to FIG. 6. In FIG. 12, PD denotes a precharge circuit for precharging respective paired data lines to predetermined potential $V_{pc}$. The precharge circuit PD is controlled by a signal PCD. Each of signal transferring means $SW_1$-$SW_n$ comprises two NMOS transistors, and the signal transferring means are so controlled by signals $GC_1$-$GC_n$ as to turn on/off. A circuit PS is a precharge circuit for precharging common paired data lines cd and $\overline{cd}$ to the predetermined potential $V_{pc}$. The precharge circuit PS is controlled by a signal PCS. Signal sensing means is represented by an example comprising cross-coupled CMOS inverters. Its operation is controlled by signals CSP and CSN.

Figure 13:
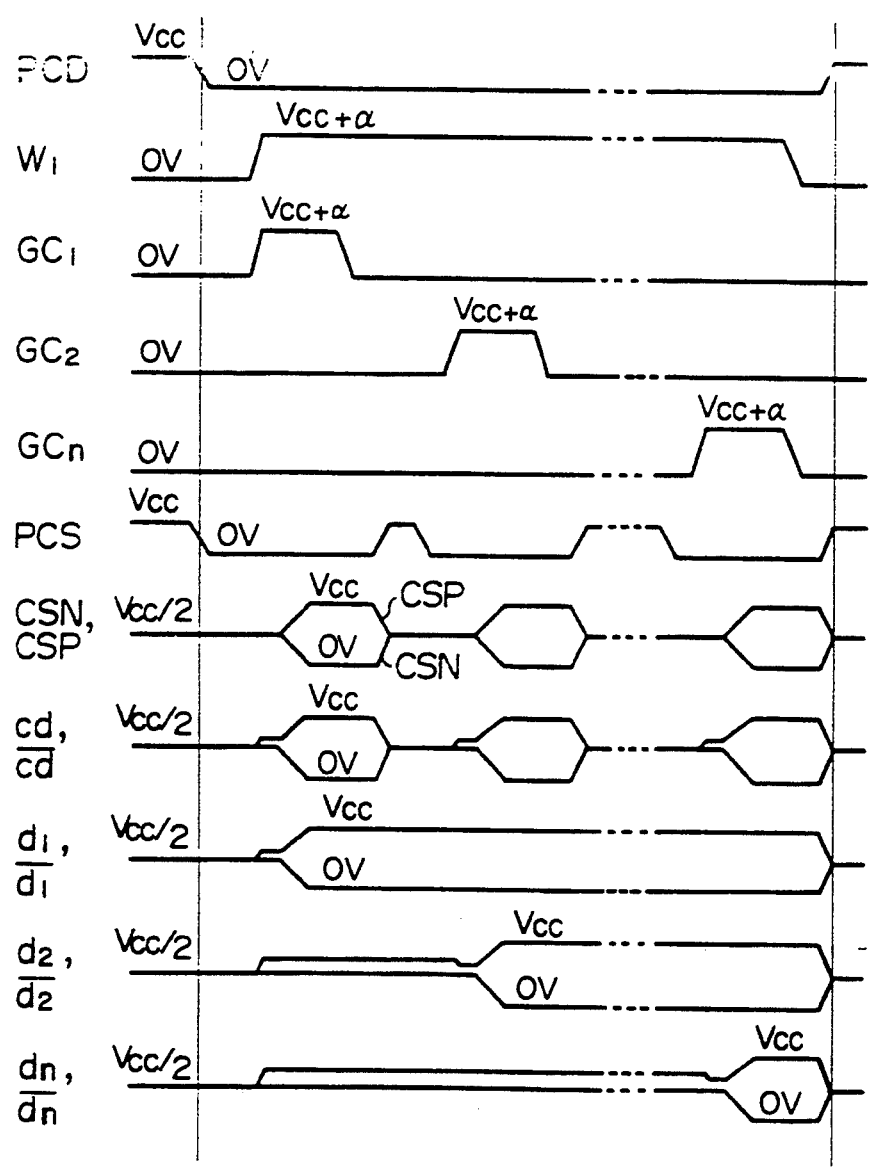
FIG. 13 is an operation timing diagram illustrating the operation of FIG. 12.

YSW denotes a circuit for reading out information amplified by the signal sensing means onto paired input-/output lines IO and $\overline{IO}$. The circuit YSW is controlled by a signal YS. This circuit is also used to store information so fed from the outside of the chip as to be written on data lines. It is assumed in FIG. 12 that a voltage equivalent to half of the power supply voltage Vcc is used as $V_{pc}$, i.e., Vcc/2 precharge method is used. In the illustrated example, dummy cells are omitted. Even in case dummy cells are needed, dummy cells can be easily added. Operation of the present embodiment will now be described with reference to FIG. 13 by taking the case where high potential is stored in each cell as an example.

First of all, respective paired data lines and common paired data lines are precharged to $V_{pc}$ (=Vcc/2) by providing the signals PCD and PCS with high potential. Then one of a plurality of word lines is selected. It is now assumed that $W_1$ is selected. And its potential is made high. Thereby signals from memory cells are read out on data lines $d_1$-$d_n$. Further, by selecting one of signal transferring means such as $SW_1$ and providing the signal $GC_1$ with high potential, a signal is read out on the common data lines as well. By activating the signal sensing means by means of the signals CSP and CSN, that signal is amplified. The signal thus amplified is transferred to the data line $d_1$ as well via the signal transferring means. Thereafter the signal $GC_1$ is provided with low potential to turn off the signal transferring means $SW_1$, paired data lines $d_1$ and $\overline{d_1}$ being disconnected from common paired data lines. The signal PCS is provided with high potential to precharge the common paired data lines to $V_{pc}$ and thereafter the signal PCS is changed to low potential. Thereafter different signal transferring means is selected and its control signal is provided with high potential. Thereby a signal read out on a data line is read out on a common data line and amplified. Such operation is repeated, and signals on all data lines are amplified and restored. Thereafter the potential of the word line is made low, and then the signals PCD and PCS are provided with the high potential, returning to the first state.

In the present embodiment, circuits which must be placed for each data line pair are only the circuit for precharging the paired data lines and signal transferring means. Each of them can be formed by using several MOS transistors, and the layout can be easily made. On the other hand, the signal sensing means having a complicated structure is shared by a plurality of data line pairs, its layout being also facilitated.

In FIG. 12, a precharge circuit is placed for each data line pair. However, this may be omitted by precharging respective data line pairs by means of a precharge circuit PS of common paired data lines. In this case, the signals $GC_1$-$GC_n$ and PCS are beforehand provided with the high potential. Common paired data lines are precharged by the precharge circuit PS, and respective paired data lines are precharged via the signal transferring means SW. After the signals $GC_1$-$GC_n$ and PCS are provided with the low potential, a word line is selected. After the operation has been finished, the signals $GC_1$-$GC_n$ and PCS are provided with the high potential again and the common paired data lines and respective paired data lines are precharged by the precharge circuit PS. By doing so, it becomes unnecessary to place a precharge circuit on each data line pair, and consequently the chip area can be reduced.

Figure 14:
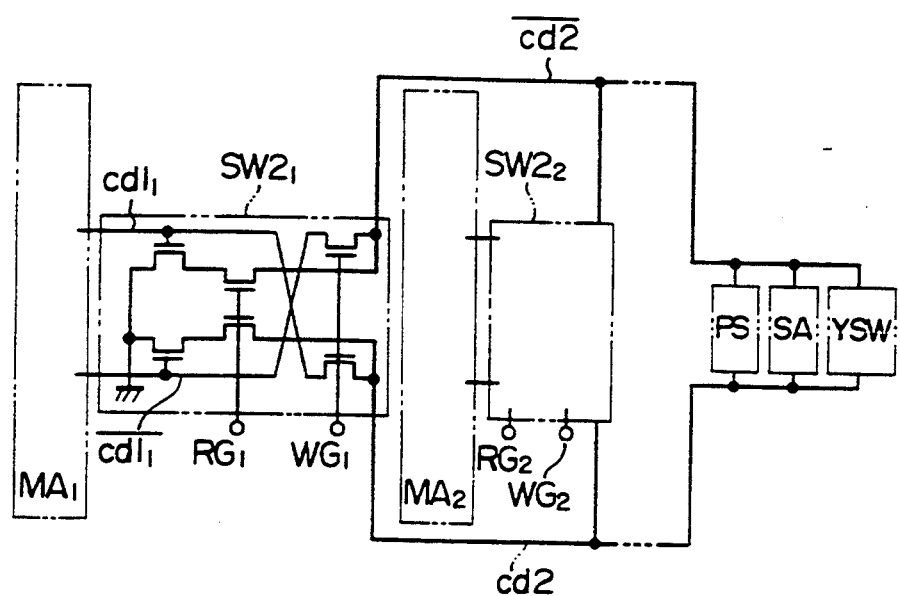
FIG. 14 is a diagram showing a more concrete embodiment of FIG. 8.

FIG. 14 shows another concrete embodiment of the present invention, which corresponds to the embodiment shown in FIG. 8. Further, in the embodiment shown in FIG. 14, signal transferring means SW2 (such as SW2, and SW2$_2$) are provided and common paired data lines are separated into cd1 and $\overline{cd1}$ (such as cd1$_1$ and $\overline{cd1}_1$) and cd2 and $\overline{cd2}$. Memory arrays MA$_1$ and MA$_2$ shown in FIG. 14 correspond to the memory array MA shown in FIG. 12. The signal transferring means SW2 (such as SW2$_1$ and SW2$_2$) comprises signal transferring means as described in JP-A-1-264692. Operation of FIG. 14 will now be described with reference to FIG. 15 by taking the case where high potential is already stored in each memory cell as an example.

As described before by referring to FIG. 13, a signal is read out on common paired lines cd1, and $\overline{cd1}$ and thereafter a signal RG$_1$ is provided with the high potential. According to the potential on common paired lines cd1$_1$ and $\overline{cd1}_1$, currents flow from the common paired data lines cd2 and $\overline{cd2}$ to the ground potential, and a difference is caused between the potential values of common paired data lines cd2 and $\overline{cd2}$. After the potential difference has been amplified by the signal sensing means SA, a signal WG$_1$ is provided with the high potential to transfer the amplified signal to the paired data lines via the common paired data lines cd1$_1$ and $\overline{cd1}_1$ as well as the signal transferring means SW$_1$. Thereafter a signal GC$_1$ is provided with the low potential to disconnect paired data lines from the common paired lines cd1$_1$ and $\overline{cd1}_1$. Then the precharge circuit PS is activated to precharge the common paired data lines cd1$_1$ and $\overline{cd1}_1$ via the common paired data lines cd2 and $\overline{cd2}$ as well as the signal transferring means SW2$_1$. The precharge circuit PS is then disabled, and the signal WG$_1$ is provided with low potential. A signal of another data line is read out and amplified. By repeating such operation, signals on all data lines are amplified. Thereafter the word line is provided with the low potential, data restoring onto respective memory cells being thus completed. Then the signals PCD and PCS are provided with the high potential to precharge the paired data lines and common paired data lines by means of the precharge circuit.

In the embodiment shown in FIG. 14 as well, the precharge circuit PD placed on each data line pair may be omitted by precharging respective data line pairs by means of the precharge circuit PS on the common data line pair as described before by referring to the embodiment of FIG. 12. Further in the embodiment shown in FIG. 14, a circuit for precharging the common paired data lines cd1$_1$ and $\overline{cd1}_1$ is not provided, but they are precharged by the precharge circuit PS via the signal transferring means SW2. However, a circuit for precharging the common paired data lines cd1, and $\overline{cd1}_1$ may be placed on the common paired data lines. Further in the present embodiment, an example in which the signal sensing means SA comprises an amplifier of dynamic type is shown. Since the signal transferring means SW2 is a circuit for converting the signal represented as a potential difference on the common data lines cd1 and $\overline{cd1}_1$ into a current, however, a circuit for sensing that current may be used.

In the present embodiment, a circuit having large input impedance viewed from the common paired data lines cd1$_1$ and $\overline{cd1}_1$ at the time of signal readout is used as the signal transferring means SW2. Therefore, parasitic capacitance of the common paired data lines cd1$_1$ and $\overline{cd1}_1$ can be separated from parasitic capacitance of cd2 and $\overline{cd2}$. Therefore, signals read out on the common paired data lines cd1$_1$ and $\overline{cd1}_1$ can be made large. Therefore, operation with high signal-to-noise ratio becomes possible.

Figure 17:
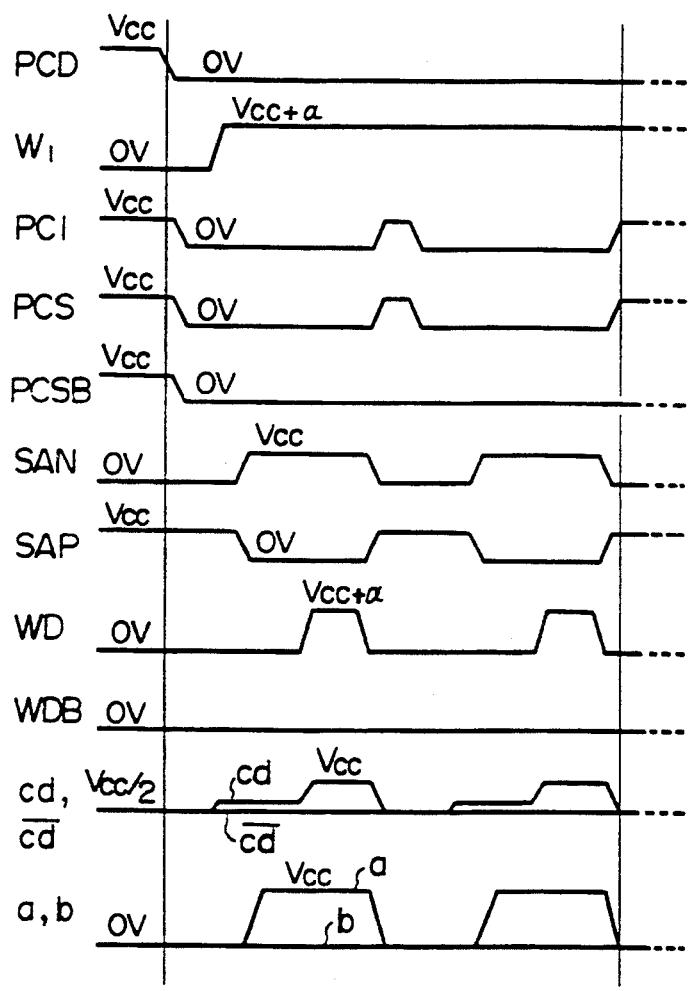
FIG. 17 is an operation timing diagram illustrating the operation of FIG. 16.

FIG. 16 shows another concrete embodiment of the present invention, which corresponds to the embodiment shown in FIG. 11. Operation of the present embodiment will now be described with reference to FIG. 17 by taking the case where high potential is stored in each memory cell as an example. First of all, respective sections are precharged by signals PCD, PCS, PCSB and PC1, and a word line is selected. Memory cell signals are read out on data lines d$_1$-d$_n$ and reference signals are read out on dummy data lines dd$_1$ and dd$_2$. Signal transferring means SW$_1$ and SW$_{d2}$ are turned on to read out a signal on the data line d$_1$ and a reference signal on the dummy data line dd$_2$ onto common data lines cd and $\overline{cd}$, respectively. Thereafter signal sensing means SA is activated by signals SAN and SAP. As a result, amplified signals appear on terminals a and b. The amplified signal on the terminal a is stored on the common data line cd by restoring means RW$_1$, and it is further stored on the data line d$_1$. At this time, a signal WDB is kept at low potential, restoring means RW$_2$ is disabled, and the reference signal on the common data line $\overline{cd}$ is held. After the amplified signal has been stored on the data line d$_1$, SW$_1$ is turned off and the signal sensing means is disabled. In addition, the common data line cd is precharged by the signal PCS and terminals in the signal sensing means are precharged by the signal PC1. Subsequently, a signal on a different data line is read out on the common data line cd and amplified by using the reference signal previously held on the common data line $\overline{cd}$. Such operation is repeated. After all signals on data lines connected to the common data line cd have been amplified, both the common data line cd and $\overline{cd}$ are precharged. A signal on a data line connected to the common data line $\overline{cd}$ is read out on the common data line $\overline{cd}$, and a reference signal on the dummy data line dd$_1$ is read out on the common data line cd. By repeating operation as described before, all signals on data lines connected to the common data line $\overline{cd}$ are amplified.

In the embodiment shown in FIG. 16, a precharge circuit PD is placed on each of data lines and dummy data lines. As described before with reference to the embodiment of FIG. 12, however, it may be omitted by precharging respective data lines and dummy data lines by means of the precharge circuit PS on the common data line.

Although the construction method of dummy data lines and dummy cells has not heretofore been described, a construction method of dummy data lines and dummy cells suitable for the present invention will now be described. Since a dummy data line is paired with a data line at the time of signal sensing as described before with reference to FIG. 10, such a structure that electrical characteristics such as parasitic capacitance value of the dummy data line balance those of the data line is needed. Further, there is needed such a dummy cell that the level outputted on a dummy data line by the dummy cell is a nearly middle level between voltage levels obtained when data "1" and "0" stored in memory cells are read out from the memory cells. In accordance with one method for realizing this, the same cell as a memory cell is used as the dummy cell and a voltage equivalent to a middle level between voltages corresponding to data "1" and "0" in memory cells is stored on the terminal within the dummy cell. This method will now be described in more detail by referring to FIG. 16.

In FIG. 16, each dummy cell DC comprises the same cell as the memory cell MC. A middle voltage between voltages of data "1" and "0" is stored on a terminal within the dummy cell beforehand. Assuming that the high potential within a memory cell is Vcc and the low potential is 0 V, for example, Vcc/2 is stored on the terminal within the dummy cell. (This method will be described later.) If a word line is selected in this state, voltage corresponding to data "1"/"0" is outputted on a data line as a memory cell signal and the nearly middle voltage is outputted on a dummy data line as a reference signal. Thereafter readout operation is performed as described before. When signals on all data lines have been amplified, each data line has high potential Vcc or low potential 0 V in response to data "1" or "0". In this state, all of signals $GC_1$-$GC_n$ are provided with the low potential to turn off all of signal transferring means $SW_1$-$SW_n$. On the other hand, signals $GCd_1$ and $GCd_2$ are provided with high potential to turn on signal transferring means $SW_{d1}$ and $SW_{d2}$. Thereafter the signals PCS and PCSB are provided with the high potential to activate the precharge circuit PS. Thereby the dummy data lines $dd_1$ and $dd_2$ are precharged to voltage $V_{pc}$ (=Vcc/2) via the signal transferring means $SW_{d1}$ and $SW_{d2}$, respectively. By making the word line unselected in this state, voltage corresponding to data "1"/"0" is stored in memory cells and Vcc/2 is stored in dummy cells. If the same cells as the memory cells are thus used as the dummy cells, the dummy data lines have the same structure as that of the data lines and it is possible to make electrical characteristics of the dummy data lines balance those of the data lines. Since the middle voltage between voltages corresponding to data "1" and "0" is stored on the terminal within the dummy cell, the middle level between voltages of data "1" and "0" outputted on the data line can be outputted by selecting a word line. Further in this method, the middle voltage stored in the dummy cell is left as it is until the next selection after the middle voltage is set simultaneously with data storing into the memory cell. That is to say, the middle voltage is decreased with time by a leak current within the dummy cell in the same way as the data of high potential side stored in the memory cell. As compared with conventional construction methods of dummy cell, such as the method as described in 1980 IEEE ISSCC Digest of Technical Papers, pp. 234–235 whereby a circuit for setting the terminal within a dummy cell at a desired potential is added to the dummy cell and the terminal is fixed to that potential during the interval of precharge, the time until the data of high potential side is so decreased as to be falsely determined as data of low potential side, i.e., the data holding time can be prolonged. This means that the time interval between refresh operations can be prolonged. For the system, the time period during which the semiconductor memory is performing the refresh operation can be made short. Conversely speaking, the time during which the semiconductor memory can be used can be prolonged. Further, thereby power required for refresh can be reduced. When the semiconductor memory is backed up by a battery, therefore the duration of the battery can be prolonged, resulting in one of merits.

Various construction methods of dummy data line and dummy cell other than this method are conceivable. In the method of precharging the data line to Vcc/2 in the embodiments heretofore described, for example, the precharge voltage can be used as the reference voltage. In this case, a cell having the shape as that of a memory cell is used as the dummy cell, but the transistor of the dummy cell is adapted not to turn on even when a word line is selected. This can be realized by implanting impurity ions into the channel region of the transistor of the dummy cell and raising the threshold voltage of the transistor. This method also can make the electrical characteristics of dummy data lines balance those of data lines. When this method is used, the fabrication process becomes complicated. Since it is not necessary to set the terminal within the dummy cell at the middle voltage unlike the above described method, however, operation control becomes simple.

As heretofore described, the embodiment shown in FIG. 16 has such a structure that a dummy data line is shared by a plurality of data lines. Therefore, memory cells can be placed in open data-line arrangement, whereas readout operation is conducted in the same way as the folded data-line arrangement. Therefore, higher density and higher signal-to-noise ratio can be attained.

The present invention has heretofore been described by referring to some embodiments. However, the present invention is not limited to embodiments described above so long as departure from the sprit of the invention is not present. For example, in the embodiments, such as the embodiment of FIG. 12, signal sensing means comprises CMOS transistors. However, signal sensing means may comprise either bipolar transistors or bipolar and CMOS transistors. In general, the area occupied by the circuit comprising them tend to become larger than that occupied by the circuit comprising only CMOS transistors. By applying the present invention, therefore, matching with the memory cell section on layout is facilitated.

Figure 18:
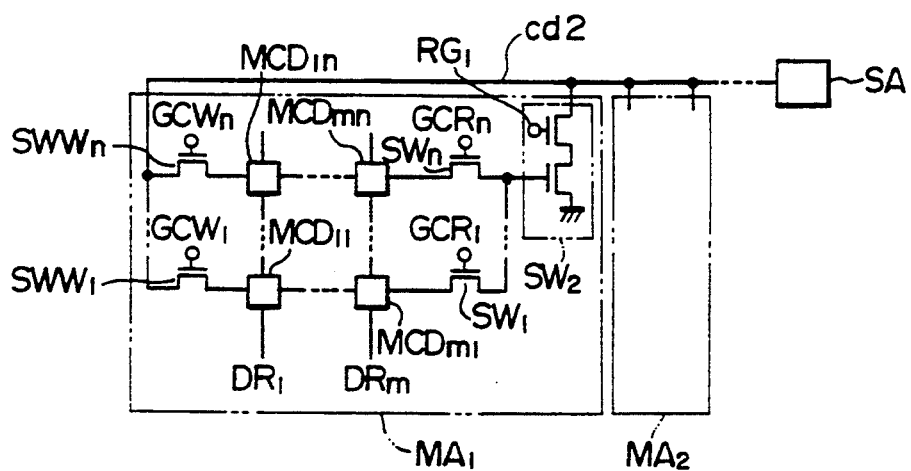
FIG. 18 is a memory array circuit diagram of a CCD memory according to the present invention.

In the foregoing description, single-transistor single-capacitor memory cells are used as memory cells. However, the present invention can also be applied to memory cells of other types. For example, the present invention can also be applied to memories comprising CCD (charge coupled device). One example thereof is shown in FIG. 18. In FIG. 18, MCD (such as $MCD_{11}$) denotes a memory cell comprising CCD. Information stored in the memory cell as the amount of charge is transferred from the left to the right by a drive line DR (such as $DR_1$). Such a memory cell is described in Electronics (Jun. 22, 1978) pp. 133–137, for example. The memory comprising CCD has the following features. ① Since the memory cell has such a simple structure that electrodes are formed on a silicon substrate, the fabrication process is simple. ② In a single-transistor single-capacitor memory cell, stored charge within the memory cell is shared between the capacitance within the memory cell and the parasitic capacitance of the data line, and thereby a memory cell signal is read out. Because of large parasitic capacitance of the data line, therefore, the signal voltage becomes small. In the CCD memory, however, stored charge is transferred in memory cells, and consequently the signal voltage inputted from a memory cell to signal transferring means can be made large. As a result, readout with high signal-to-noise ratio becomes possible. Memories comprising CCD have these features. In the example shown in FIG.

18, n data are simultaneously transferred to the right end by driving drive lines. These plurality of data are serially read out onto a common data line cd2 via signal transferring means SW (such as $SW_1$) and SW2, and inputted to signal sensing means SA, the data being amplified therein. To be concrete, one of n data transferred to the right end is transmitted to the signal transferring means SW2 by selecting one of signal transferring means SW's. At this time, information is stored in a CCD memory cell as the amount of charge. Therefore, that information appears as a change of potential on the input terminal of the signal transferring means SW2. Thereafter a signal $RG_1$ is provided with high potential to activate the signal transferring means SW2, and the information is converted into an amount of current flowing through the signal transferring means SW2. This information is inputted to the signal sensing means SA via the common data line cd2 and sensed therein. By using the result, information to be restored is then transferred to signal transferring means SWW (such as $SWW_1$) of the storing side via the common data line. By selecting signal transferring means belonging to the same line as that of the selected signal transferring means SW, the information is restored into the memory cell. Different signal sensing means SW is then selected, and similar operation is repeated, n data being successively detected. In a memory comprising CCD as well, application of the present invention can facilitate the layout of signal sensing means. Further, by arranging memory cells in blocks such as $MA_1$ and $MA_2$ as shown in FIG. 18, the number of memory cells included in the information transfer path can be reduced and consequently the charge loss caused at the time of transfer can also be reduced. Further, if a circuit having a MOS transistor gate as the input terminal is used as the signal transferring means SW2 as in the embodiment shown in FIG. 18, the signal voltage from a memory cell is not affected by the parasitic capacitance of the common data line cd2, readout with high signal-to-noise ratio being made possible.

The fact that the present invention can be applied to single-transistor signal-capacitor memory cells and CCD memory cells has heretofore been described. However, the present invention can be applied to any memory cells so long as a plurality of minute signals are read out at a time by selection operation.

The present invention is capable of reducing the number of signal sensing means and restoring means and relaxing the layout pitch of these means. Therefore, a semiconductor memory with higher density can be realized.

It is further understood by those in the art that the foregoing description is preferred embodiment of the disclosed device and that various changes and modifications may be made in the invention without departing from the spirit and scope thereof.

What is claimed is:

1. In a semiconductor memory chip which comprises a plurality of word lines; a plurality of data lines each disposed, with respect to a plan view arrangement, as to intersect said plurality of word lines; a plurality of memory cells, each comprised of a one transistor, one capacitor cell, disposed at desired intersections of said plurality of word lines and said plurality of data lines so that each memory cell is connected to a word line and a data line; signal sensing means so disposed as to be common to said plurality of data lines; a plurality of signal transferring means, each of which having a switching function, for electrically coupling said signal sensing means to said plurality of data lines, respectively; a data output terminal for providing data of the memory chip to outside the memory chip; and a register coupled between said data output terminal and said signal sensing means, a method of reading data to be outputted from said semiconductor memory chip and inputting data thereto comprising the steps of:

provzing data from memory cells corresponding to an individual word line onto said plurality of data lines in accordance with selection of said individual word line;

effecting selection of each of said plurality of data lines, successively;

electrically coupling each successively selected data line to said signal sensing means;

storing the data on said plurality of data lines into said register through said signal sensing means; and providing readout data from said register to said data output terminal of the memory chip.

2. The method according to claim 1, further comprising the steps of:

inputting data to said register through said data output terminal;

effecting a selection of each of said plurality of data lines, successively; and successively transferring the data stored in said register to the successively selected data lines, respectively.

3. The method according to claim 1, wherein the step of the successive selection of each of said plurality of data lines is effected upon each occurrence of selection of a word line.

4. In a semiconductor memory chip which comprises a plurality of word lines; a plurality of data lines each disposed, with respect to a plan view arrangement, as to intersect said plurality of word lines; a plurality of memory cells disposed at desired intersections of said plurality of word lines and said plurality of data lines so that each memory cell is connected to a word line and a data line; a sensing circuit so disposed as to be common to said plurality of data lines; a signal switching circuit electrically coupling said sensing circuit to said plurality of data lines, respectively; a data input/output terminal for providing data of the memory chip outside the memory chip; and a register coupled between said data input/output terminal and said sensing circuit, a method of reading data to be outputted from said semiconductor memory chip and inputting write data thereto comprising the steps of:

(a) simultaneously providing read data from memory cells corresponding to a word line onto said plurality of data lines in accordance with a selection signal applied to said word line;

(b) during the time of the word line selection signal, each of said plurality of data lines is selected successively for coupling to said sensing circuit via said signal switching circuit;

(c) successively storing the read data on said plurality of data lines into said register through said sensing circuit during the time of the word line selection signal; and (d) providing readout data from said register to said data input/output terminal; and (e) repeating steps (a) to (d) in that order until readout data representative of all of said plurality of memory cells are provided at said input/output terminal.

5. The method according to claim 4, further comprising the steps of:
   (f) inputting write data to said register through said data input/output terminal;
   (g) effecting a selection of each of said plurality of data lines, successively; and
   (h) successively transferring the write data stored in said register to the successively selected data lines, respectively, via said signal switching circuit.

6. The method according to claim 5, wherein each of said plurality of memory cells is a one transistor, one capacitor type dynamic RAM cell.

7. The method according to claim 6, wherein said signal switching circuit includes a plurality of transfer switches for, respectively, electrically coupling said plurality of data lines to said sensing circuit.

8. The method according to claim 5, wherein said signal switching circuit includes a plurality of transfer switches for, respectively, electrically coupling said plurality of data lines to said sensing circuit.

9. A semiconductor device chip having a memory comprising:
   a plurality of word lines;
   a plurality of data line pairs, each data line pair consisting of two data lines spaced away from each other, and each pair of said plurality of data line pairs so disposed, with respect to a plan view arrangement, as to intersect said plurality of word lines;
   a plurality of memory cells disposed at desired intersections of said plurality of word lines and said plurality of data line pairs so that each memory cell is connected to a word line and a data line;
   signal sensing means so disposed as to be common to said plurality of data line pairs; and
   a plurality of signal transferring means, each of which having a switching function, for electrically coupling said signal sensing means to said plurality of data line pairs, respectively;
   a data output terminal for outputting data to outside of said semiconductor device chip; and
   a register coupled between said data output terminal and said signal sensing means,
   wherein, each of said plurality of memory cells is comprised of a one transistor, one capacitor type cell,
   wherein, by selecting one word line of said plurality of word lines, respective signals are read out on said plurality of data line pairs from memory cells which are connected to said selected word line,
   wherein said respective signals thus read out on said plurality of data line pairs are successively sensed by said signal sensing means by making successive selections of said plurality of signal transferring means, and
   wherein said respective signals are outputted through said register.

10. The semiconductor device chip according to claim 9, further comprising:
    a plurality of dummy word lines so disposed as to intersect said plurality of data line pairs; and
    a plurality of dummy cells disposed at desired intersections of said plurality of dummy word lines and said plurality of data line pairs.

11. The semiconductor device chip according to claim 9, wherein each pair of said plurality of data line pairs is arranged according to an open data line scheme.

12. The semiconductor device chip according to claim 9, wherein each pair of said plurality of data line pairs is arranged according to a folded data line scheme.

13. A semiconductor device chip having a memory comprising:
    a plurality of word lines;
    a plurality of data line pairs, each data line pair consisting of two data lines spaced away from each other, and each pair of said plurality of data line pairs so disposed, with respect to a plan view arrangement, as to intersect said plurality of word lines;
    a plurality of memory cells disposed at desired intersections of said plurality of word lines and said plurality of data line pairs so that each memory cell is connected to a word line and a data line;
    a sensing circuit so disposed as to be common to said plurality of data line pairs; and
    a signal switching circuit for electrically coupling said sensing circuit to said plurality of data line pairs, respectively;
    a data output terminal for outputting data to outside of said semiconductor device chip; and
    a register coupled between said data output terminal and said sensing circuit,
    wherein, each of said plurality of memory cells is a one transistor, one capacitor type cell,
    wherein, by selecting one word line of said plurality of word lines, respective signals are read out on said plurality of data line pairs from memory cells which are connected to said selected word line,
    wherein said respective signals thus read out on said plurality of data line pairs are successively sensed by said sensing circuit by making successive signal transfer selections via said signal switching circuit, and
    wherein said respective signals are outputted through said register.

14. The semiconductor device chip according to claim 13, further comprising:
    a plurality of dummy word lines so disposed as to intersect said plurality of data line pairs; and
    a plurality of dummy cells disposed at desired intersections of said plurality of dummy word lines and said plurality of data line pairs.

15. The semiconductor device chip according to claim 13, wherein each pair of said plurality of data line pairs is arranged according to an open data line scheme.

16. The semiconductor device chip according to claim 13, wherein each pair of said plurality of data line pairs is arranged according to a folded data line scheme.

17. The semiconductor device chip according to claim 14, wherein each pair of said plurality of data line pairs is arranged according to an open data line scheme.

18. The semiconductor device chip according to claim 14, wherein each pair of said plurality of data line pairs is arranged according to a folded data line scheme.

19. The semiconductor device chip according to claim 13, wherein said signal switching circuit includes a plurality of transfer switches for, respectively, electrically coupling said plurality of data line pairs to said sensing circuit.

20. The semiconductor device chip according to claim 19, wherein said sensing circuit operates differentially on readout signals received from successively selected data line pairs.

21. The semiconductor device chip according to claim 17, wherein said signal switching circuit includes a plurality of transfer switches for, respectively, electrically coupling said plurality of data line pairs to said sensing circuit.

22. The semiconductor device chip according to claim 21, wherein said sensing circuit operates differentially on readout signals received from successively selected data line pairs.

23. The semiconductor device chip according to claim 18, wherein said signal switching circuit includes a plurality of transfer switches for, respectively, electrically coupling said plurality of data line pairs to said sensing circuit.

24. The semiconductor device chip according to claim 23, wherein said sensing circuit operates differentially on readout signals received from successively selected data line pairs.

* * * * *